(12) United States Patent
Lee et al.

(10) Patent No.: US 7,582,404 B2
(45) Date of Patent: Sep. 1, 2009

(54) PHOTOSENSITIVE PASTE COMPOSITION, PDP ELECTRODE MANUFACTURED USING THE COMPOSITION, AND PDP COMPRISING THE PDP ELECTRODE

(75) Inventors: Beom-Wook Lee, Suwon-si (KR); Dong-Hee Han, Suwon-si (KR); Sang-Wook Sin, Suwon-si (KR); Jin-Hwan Jeon, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 397 days.

(21) Appl. No.: 11/158,415

(22) Filed: Jun. 22, 2005

(65) Prior Publication Data
US 2005/0287472 A1 Dec. 29, 2005

(30) Foreign Application Priority Data
Jun. 24, 2004 (KR) .............. 10-2004-0047618

(51) Int. Cl.
G03C 1/498 (2006.01)
G03C 3/00 (2006.01)
H01L 21/00 (2006.01)
C08K 3/10 (2006.01)

(52) U.S. Cl. ............... 430/270.1; 430/9; 430/311; 524/403

(58) Field of Classification Search ......... 430/270.1, 430/9, 311; 524/403
See application file for complete search history.

(56) References Cited

U.S. PATENT DOCUMENTS

| | | | | |
|---|---|---|---|---|
| 5,972,564 | A * | 10/1999 | Kawana et al. | 430/281.1 |
| 6,103,452 | A * | 8/2000 | Kakinuma et al. | 430/281.1 |
| 6,326,125 | B1 * | 12/2001 | Kakinuma et al. | 430/281.1 |
| 6,555,594 | B1 * | 4/2003 | Fukushima et al. | 522/81 |
| 2002/0163108 | A1 * | 11/2002 | Oshio et al. | 264/614 |
| 2003/0161959 | A1 * | 8/2003 | Kodas et al. | 427/376.2 |

FOREIGN PATENT DOCUMENTS

| | | | |
|---|---|---|---|
| EP | 863534 A2 | * | 9/1998 |
| JP | 10-273338 | | 10/1998 |
| JP | 10273338 A | * | 10/1998 |
| JP | 11-283508 | | 10/1999 |
| JP | 11-339554 | | 10/1999 |
| JP | 11339554 A | * | 12/1999 |
| JP | 2002080901 A | * | 3/2002 |
| JP | 2002-169274 | | 6/2002 |
| JP | 2004-079994 | | 3/2004 |

OTHER PUBLICATIONS

Kosaka, Yasuo, (*Microparticle Handbook*), 1991.
Office Action issued by the Korean Patent Office on Jan. 28, 2009 in 4 pgs.

* cited by examiner

*Primary Examiner*—David Wu
*Assistant Examiner*—Michael M Bernshteyn
(74) *Attorney, Agent, or Firm*—Knobbe Martens Olson & Bear, LLP

(57) ABSTRACT

A photosensitive paste composition is provided. The photosensitive paste composition contains conductive powder, an inorganic binder, and an organic vehicle, wherein, assuming that 10% by weight of the particles consisting the conductive powder have a diameter less than $D_{10}$ and 90% by weight of the particles have a diameter greater than $D_{90}$, a difference between $D_{10}$ and $D_{90}$ is about 2.0 μm or less. The photosensitive paste composition solves problems arising with use of conductive powder having a broad particle diameter distribution and satisfy requirements for an electrode's main characteristics, such as resistance, the anti-sanding property of terminal portions, and withstanding voltage characteristic. In addition, a PDP electrode using the photosensitive paste composition and a PDP including the PDP electrode can be manufactured.

20 Claims, 2 Drawing Sheets

PHOTOSENSITIVE PASTE COMPOSITION, PDP ELECTRODE MANUFACTURED USING THE COMPOSITION, AND PDP COMPRISING THE PDP ELECTRODE

CROSS-REFERENCE TO RELATED PATENT APPLICATION

This application claims the benefit of Korean Patent Application No. 10-2004-0047618, filed on Jun. 24, 2004, in the Korean Intellectual Property Office, the disclosure of which is incorporated herein in its entirety by reference.

BACKGROUND OF THE INVENTION

1. Field of the Invention

One embodiment relates to a photosensitive paste composition, a plasma display panel (hereinafter, referred to as "PDP") electrode manufactured using the photosensitive paste composition, and a PDP comprising the PDP electrode. More particularly, the present embodiment relates to a photosensitive paste composition that contains conductive powder having an optimized particle diameter and particle diameter distribution to improve electrode characteristics, a PDP electrode manufactured using the photosensitive paste composition, and a PDP comprising the PDP electrode.

2. Description of the Related Art

Recently, various pattern machining techniques have been developed with the increasing need for large, high density, high definition, highly reliable display devices. In addition, compositions for forming various microelectrodes that are compatible with such various pattern machining techniques have been vigorously researched.

PDPs have been used in various fields since PDPs have faster response speed and can be more easily manufactured with a large size compared with liquid crystal panels. In general, patterning electrode materials using screen printing has been used as a conventional method of forming electrodes on a PDP. However, this method requires high proficiency, and patterns for high definition, large screens for PDPs are difficult to be obtained with this conventional screen printing method since this method uses a screen with a low resolution. Furthermore, the conventional screen printing method leads to a short-circuit or disconnection during a printing process due to the use of the screen and limits the resolution. Therefore, it is limited to manufacture micro-electrode patterns using the conventional screen printing method.

Therefore, in recent years, photolithography using photosensitive paste has been developed to form a high resolution electrode pattern suitable for large screens. This photography technique is a method of forming patterned electrodes by coating the entire surface of a substrate, for example, a glass substrate, with a photosensitive paste, drying the substrate under predetermined conditions, exposing the substrate using a UV exposure apparatus with a photomask, performing developing to remove an uncured portion shielded by the photomask using a suitable developing solution, and calcinating the remaining cured layer at a predetermined temperature.

The photosensitive paste contains conductive powder, an inorganic binder, such as glass frits, a copolymer binder, a photoinitiator, and a solvent, etc. The conductive powder is a material for providing conductivity to electrodes. Silver, gold, copper, platinum, palladium, aluminum, an alloy thereof and the like can be used as conductive powder. Among these materials, silver powder is widely used as conductive powder since silver powder has superior conductivity, can be easily processed into fine powder, and has low cost.

In general, silver powder used for PDP electrodes has an average particle diameter of about 0.1 to about 10.0 μm, and a specific surface area of about 0.3 to about 2.0 m²/g. In general, when the average particle diameter is about 1.0 μm, the minimum particle diameter ($D_{min}$) ranges from about 0.1 μm to about 0.3 μm, and the maximum particle diameter ($D_{max}$) ranges from about 6.0 μm to about 8.0 μm. When the average particle diameter is about 2.0 μm, the minimum particle diameter ranges from about 0.3 μm to about 0.5 μm, and the maximum particle diameter ($D_{max}$) ranges from about 8.0 μm to about 10.0 μm. However, Since conventionally used silver powder has a wide particle diameter distribution, it cannot satisfy the requirements for an electrode's main characteristics, for example, in terms of resistance, the anti-sanding property of terminal portions, withstanding voltage characteristics, etc.

In addition, when silver powder has a wide particle diameter distribution, such silver powder contains particles having diameters smaller than about 0.5 μm and larger than about 5.0 μm. In this case, silver particles having diameters smaller than about 0.5 μm lowers the sensitivity to exposure and results in undercuts after a developing process. Also, such small silver particles have strong sintering behavior and lead to serious shrinking during a calcination process. As a result, serious edge curling occurs during the calcination process, thereby deteriorating withstanding voltage characteristics. Meanwhile, silver particles having diameters larger than 5.0 μm degrades the linearity of electrode patterns, and in particular, degrades the density of the electrodes after calcination due to inferior sintering property, thereby raising resistance and causing damage, a detachment or disconnection on terminal portions of the electrodes during a sanding process.

SUMMARY OF THE INVENTION

One embodiment provides a photosensitive paste composition that can satisfy the requirements for an electrode's main characteristics, in terms of resistance, the anti-sanding property of terminal portions, and withstanding voltage characteristics, an electrode for PDPs that is manufactured using the photosensitive paste composition, and a PDP including the electrode.

According to an aspect of the present embodiment, there is provided a photosensitive paste composition for forming an electrode for PDPs, the composition comprising conductive powder, an inorganic binder, and an organic vehicle, wherein, assuming that 10% by weight of the particles comprising the conductive powder have a diameter less than $D_{10}$ and 90% by weight of the particles have a diameter greater than $D_{90}$, the difference between $D_{10}$ and $D_{90}$ is about 2.0 μm or less.

According to another aspect of the present embodiment, there is provided an electrode for PDPs that is manufactured using the photosensitive paste composition.

According to another aspect of the present embodiment, there is provided a PDP including the electrode.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

Hereinafter, the present embodiments will be described in detail.

A photosensitive paste composition according to the present embodiments contains conductive powder, an inorganic binder, and an organic vehicle, wherein assuming that 10% by weight of the particles comprising the conductive powder have a diameter less than $D_{10}$ and 90% by weight of the particles have a diameter greater than $D_{90}$, the difference between $D_{10}$ and $D_{90}$ is about 2.0 µm or less.

One aspect of the photosensitive paste contains conductive powder having such a narrow particle diameter distribution and thus can lower the resistance of electrodes manufactured therefrom and improve anti-sanding characteristics and withstanding voltage characteristics.

Conventional conductive powder is produced using either a wet process or a dry process. However, such conductive powder has a broad particle size distribution. However, conductive powder according to one of the embodiments has a very narrow particle diameter distribution with a difference of about 2.0 µm or less between $D_{10}$ and $D_{90}$. If the difference in particle diameter does not lie in the range, i.e., if conductive powder contain particles having a diameter smaller than 0.5 µm and particles having a diameter larger than about 5.0 µm, the problems arising with conventional conductive powder having a wide particle size distribution as described above occur.

The conductive powder according to one embodiment may have an average particle diameter ranging from about 1.0 µm to about 2.0 µm, a minimum particle diameter ($D_{min}$) of about 0.5 µm or larger, and a maximum particle diameter ($D_{max}$) of about 5.0 µm or smaller.

If the average particle diameter of the conductive powder is smaller than about 1.0 µm, or if the minimum particle size ($D_{min}$) is smaller than about 0.5 µm, the exposure sensitivity of the paste decreases, and an undercut is generated after a developing process. In addition, due to strong sintering behavior, the composition greatly shrinks and leads to serious edge curling during calcination, thereby deteriorating withstanding voltage characteristics. Meanwhile, if the average particle diameter of the conductive powder is greater than about 2.0 µm, or if the maximum particle diameter ($D_{max}$) is greater than about 5.0 µm, the paste composition reduces the linearity of a resulting electrode pattern, and in particular, lowers the density of the electrode after calcination due to poor sintering characteristics, thereby increasing the resistance of the electrode and resulting in damage, a detachment, or disconnection on terminal portions of the electrode during a sanding process.

Figure 1:
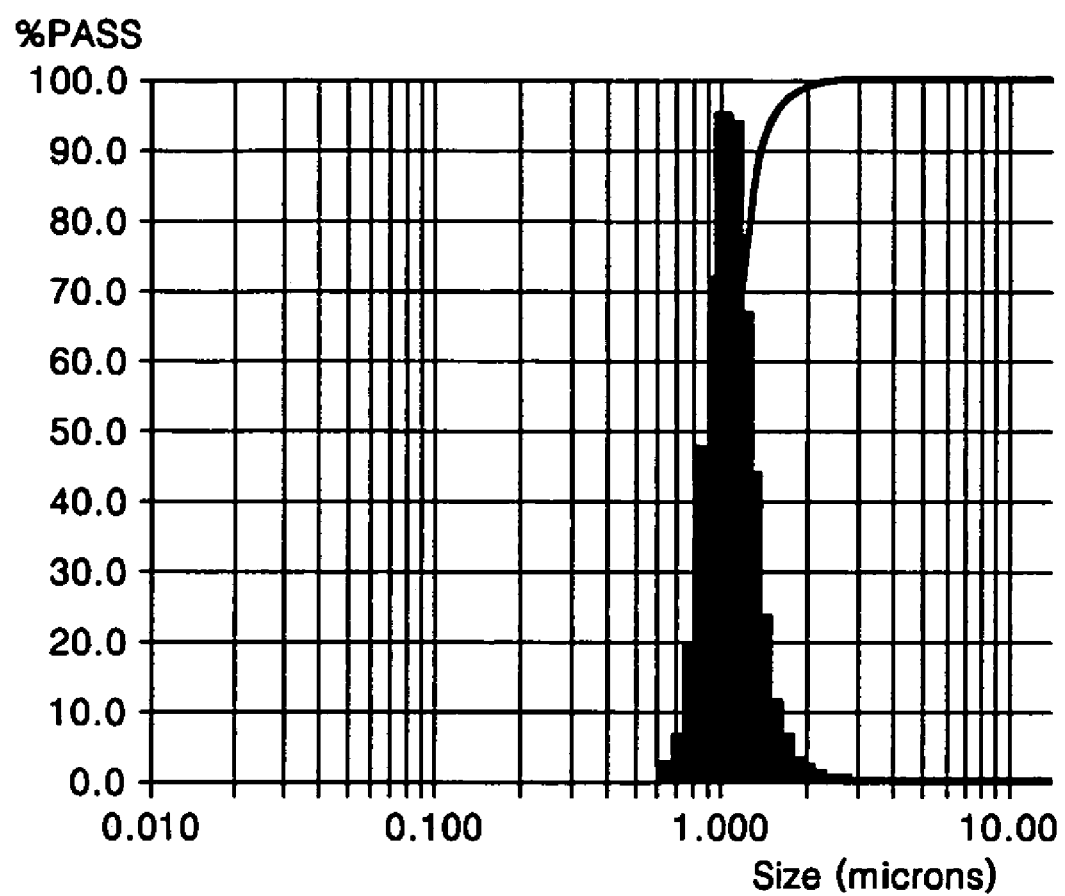
FIG. 1 is a graph of particle diameter distribution in conductive powder used in the present embodiments.

FIG. 1 is a graph of particle diameter distribution of conductive powder used in the present embodiments. Referring to FIG. 1, one embodiment of the present conductive powder has a $D_{50}$ of 1.02 µm, a $D_{min}$ of 0.58 µm, a $D_{max}$ of 2.94 µm, a $D_{10}$ of 0.87 µm, and a $D_{90}$ of 1.38 µm, indicating that the conductive powder has a very narrow particle diameter distribution.

The photosensitive paste composition according to one aspect of the present embodiment may contain about 0.1 to about 10 parts by weight of an inorganic binder and about 20 to about 100 parts by weight of an organic vehicle, based on 100 parts by weight of the conductive powder.

If the content of the conductive powder in the paste composition lies below the above range, the line width of a conductive layer seriously shrink during calcination and disconnection occurs. If the content of the conductive powder in the paste composition exceeds the above range, a desired pattern cannot be obtained due to poor pattern formation and insufficient cross-linking caused by reduced light transmittance.

Silver, gold, copper, platinum, palladium, aluminum, or an alloy thereof can be used as conductive powder, with silver powder being preferred. Also, the conductive powder may have a spherical particle shape. Spherical particles have superior packing ratio and UV transmittance to planar or amorphous particles.

In addition, the photosensitive paste composition according to the present embodiment includes an inorganic binder, which improve the sintering behavior of the conductive powder during calcination and provides the adhesion between the resulting conductive layer and the glass substrate. The content of the inorganic binder may be in a range of about 0.1 to about 10 parts by weight based on 100 parts by weight of the conductive powder. If the content or the inorganic binder is smaller than about 0.1 parts by weight, the conductive powder does not properly sinter, thereby reducing the adhesion between the conductive layer and the glass substrate and delaminating the conductive layer during subsequent processes. If the content of the inorganic binder is greater than about 10 parts by weight, undesirably the resistance of the conductive layer increases.

Examples of the inorganic binder which can be used, include but are not limited to, a $PbO$—$SiO_2$ binder, a $PbO$—$B_2O_3$—$SiO_2$ binder, a $ZnO$—$SiO_2$ binder, a $ZnO$—$B_2O_3$—$SiO_2$ binder, a $Bi_2O_3$—$SiO_2$ binder, and a $Bi_2O_3$—$B_2O_3$—$SiO_2$ binder. The inorganic binder can have any shape, preferably, spherical shape, and have an average particle diameter of about 5.0 µm or less. If the average particle diameter of the inorganic binder is greater than about 5.0 µm, an uneven layer is obtained through calcination, and the linearity of the resulting pattern is poor.

The inorganic binder may have a softening temperature of from about 400 to about 600° C. If the inorganic binder has a softening temperature lower than about 400° C., decomposition of organic substance is hindered during calcination. If the inorganic binder has a softening temperature greater than about 600° C., the glass substrate is bendable when the inorganic binder softens, and thus the calcination temperature cannot be raised to such a high temperature at which the inorganic binder softens.

In addition, the photosensitive paste composition according to one aspect of the present embodiment includes an organic vehicle. The content of the organic vehicle may be in a range of about 20 to about 100 parts by weight based on 100 parts by weight of the conductive powder. If the content of the organic vehicle is less than about 20 parts by weight, the photosensitive paste composition has poor printability and low exposure sensitivity. If the content of the organic vehicle is greater than about 100 parts by weight, the line width of a resulting conductive layer seriously shrinks and disconnection occurs.

The organic vehicle contains a copolymer of a monomer having carboxyl group and at least one unsaturated ethylenic monomer as a binder, a cross linking agent, a photoinitiator, and a solvent.

The organic vehicle may contain about 20 to about 150 parts by weight of a cross linking agent, about 5 to about 150 parts by weight of a photoinitiator, and about 100 to about 500 parts by weight of a solvent, based on 100 parts by weight of the copolymer of a monomer having a carboxyl group and at least one unsaturated ethylenic monomer.

The copolymer of a monomer having a carboxyl group and at least one unsaturated ethylenic monomer enables the composition according to the present embodiments to be developed in an aqueous alkali solution. If the content of the binder in the organic organic vehicle lies below the range, printability deteriorates. If the content of the organic vehicle exceeds the range, developability deteriorates and residues are formed around the calcinated film.

The monomer having a carboxyl group may be at least one selected from the group consisting of acrylic acid, methacrylic acid, fumaric acid, maleic acid, vinyl acetate, and an anhydride thereof. The unsaturated ethylenic monomer may be at least one selected from the group consisting of methyl acrylate, methyl methacrylate, ethyl acrylate, ethyl methacrylate, n-butyl acrylate, n-butyl methacrylate, iso-butyl acrylate, iso-butyl methacrylate, 2-hydroxyethyl acrylate, 2-hydroxyethyl methacrylate, ethylene glycol monomethyl ether acrylate, and ethylene glycol monomethyl ether methacrylate.

A cross-linkable group may be added into the binder by reacting the carboxyl group in the copolymer and an unsaturated ethylenic compound. An unsaturated ethylenic compound may be at least one selected from the group consisting of glycidylmethacrylate, 3,4-epoxycyclohexylmethylmethacrylate, and 3,4-epoxycyclohexylmethylacrylate.

Further, the copolymer may be used alone as a binder or in combination with at least one material selected from the group consisting of cellulose, hydroxymethyl cellulose, hydroxyethyl cellulose, carboxymethyl cellulose, carboxyethyl cellulose and carboxyethylmethyl cellulose to improve film leveling or thixotropic characteristics.

The copolymer may have a molecular weight of about 5,000 to about 50,000 g/mol and an acid number of about 20 to about 100 mgKOH/g. If the copolymer has a molecular weight smaller than about 5,000 g/mol, the paste composition has poor printability. If the copolymer has a molecular weight greater than about 50,000 g/mol, non-exposed portion cannot be selectively removed during a developing process. Further, if the copolymer has an acid number smaller than about 20 mg KOH/g, the paste composition has poor developability. If the copolymer has an acid number greater than about 100 mgKOH/g, undesirably both the non-exposed portion and the exposed portion are developed.

A mono-functional monomer or a multi-functional monomer can be used as the cross-linking agent for the organic vehicle. In general, multi-functional monomers which have high exposure sensitivity are used. Examples of multi-functional monomers that can be used in the present embodiments include, but are not limited to, diacrylates, such as ethylene glycol diacrylates (EDGA); triacrylates, such as trimethylolpropane triacrylate (TMPTA), trimethylolpropane ethoxylatetriacrylate (TMPEOTA), and pentaerythritoltriacrylate (PETA); tetraacrylates, such as tetramethylolpropane tetraacrylate, and pentaerythritoltetraacrylate; and hexaacrylates such as dipentaerythritol hexaacrylate (DPHA). At least one of the above-listed multi-functional monomers can be used. The content of the cross-linking agent may be in a range of about 20 to about 150 parts by weight based on 100 parts by weight of the copolymer binder. If the content of the cross-linking agent is smaller than about 20 parts by weight, a calcinated layer having a desired line width cannot be obtained due to the low exposure sensitivity. If the content of the cross-linking agent is greater than about 150 parts by weight, undesirably residues are formed in a resulting calcinated layer.

The photoinitiator can be at least one of, but is not limited to, benzophenone, o-benzoylbenzoic acid methyl, 4,4-bis(dimethylamine)benzophenone, 4,4-bis(diethylamino)benzophenone, 2,2-diethoxyacetophenone, 2,2-dimethoxy-2-phenyl-2-phenylacetophenone, 2-methyl-[4-(methylthio)phenyl]-2-morpholinopropane-1-one, 2-benzyl-2-dimethylamino-1-(4-morpholinophenyl)-1-butanone, bis(2,6-dimethoxybenzoyl)-2,4,4-trimethylpentylphosphine oxide, and bis(2,4,6-trimethylbenzoyl)phenylphosphine oxide. The content of the photoinitiator may be in a range of about 5 to about 100 parts by weight based on 100 parts by weight of the copolymer binder. If the content of the photoinitiator is smaller than about 5 parts by weight, a calcinated layer having a desired line width cannot be obtained due to the reduced exposure sensitivity. If the content of the cross-linking agent is greater than about 100 parts by weight, undesirably residues are formed in a calcinated layer.

Any solvent that can dissolve the binder and the photoinitiator, is miscible with the cross-linking agent and other additives, and has a boiling point of about 150° C. or higher can be used in the present embodiments. If the boiling point of a solvent is lower than about 150° C., the solvent is prone to vaporize during the preparation of the composition, in particular, during a 3-roll milling process, and the solvent vaporizes so quickly during a printing process that printing quality deteriorates. Examples of solvents that satisfy the above-described requirements include ethyl carbitol™ (diethylene glycol ethyl ether) (Dow Chemical Corporation, Midland, Mich.), butyl carbitol™, ethyl carbitol™ acetate, butyl carbitol™ acetate, texanol, terpine oil, dipropylene glycol methyl ether, dipropylene glycol ethyl ether, dipropyleneglycol monomethyl ether acetate, γ-butyrolactone, cellosolve™ (2-ethoxyethanol) (Dow Chemical, Midland, Mich.) acetate, butyl cellosolve™ acetate, and tripropylene glycol. At least one of the above-listed solvents can be used. The content of the solvent may be in a range of about 100 to about 500 parts by weight based on 100 parts by weight. If the content of the solvent is smaller than about 100 parts by weight, the paste has too high viscosity to achieve proper printing. If the content of the solvent is greater than about 500 parts by weight, the paste composition has too low viscosity to achieve proper printing.

In addition, the organic vehicle can further contain additives, such as a sensitizer for improving sensitivity, a polymerization inhibitor and an anti-oxidizing agent for improving the preservability of the composition, a UV absorber for improving the degree of resolution, an anti-foaming agent for suppressing foaming in the composition, a dispersing agent for improving dispersability, a leveling agent for improving the flatness of a printed layer, and a plasticizer for providing thixotropic characteristics, etc.

Another aspect provides an electrode for PDPs that is manufactured using the photosensitive paste composition described above. The electrode is produced through micro-pattern formation and calcination processes.

An example of the micro-pattern formation process involves: coating the photosensitive paste composition on a surface of a substrate using a screen printer with a screen mask, such as SUS 325 mesh or SUS 400 mesh; drying the coated specimen at a temperature of about 80 to about 150° C. for about 5 to about 30 min in a convection oven or an IR oven; exposing the resulting paste coated layer to light of about 300 to about 450 nm using a light source to form a micro-pattern; and developing the resulting micro-pattern in a suitable developing solution, such as solutions of $Na_2CO_3$, KOH, TMAH and the like, at about 30° C. In the calcination process, the resulting micro-pattern is calcinated in, for example, an electrical furnace at a temperature of about 500 to about 600° C. for about 10 to about 30 minutes.

In another aspect, there is provided a PDP comprising the PDP electrode manufactured as described above.

Figure 2:
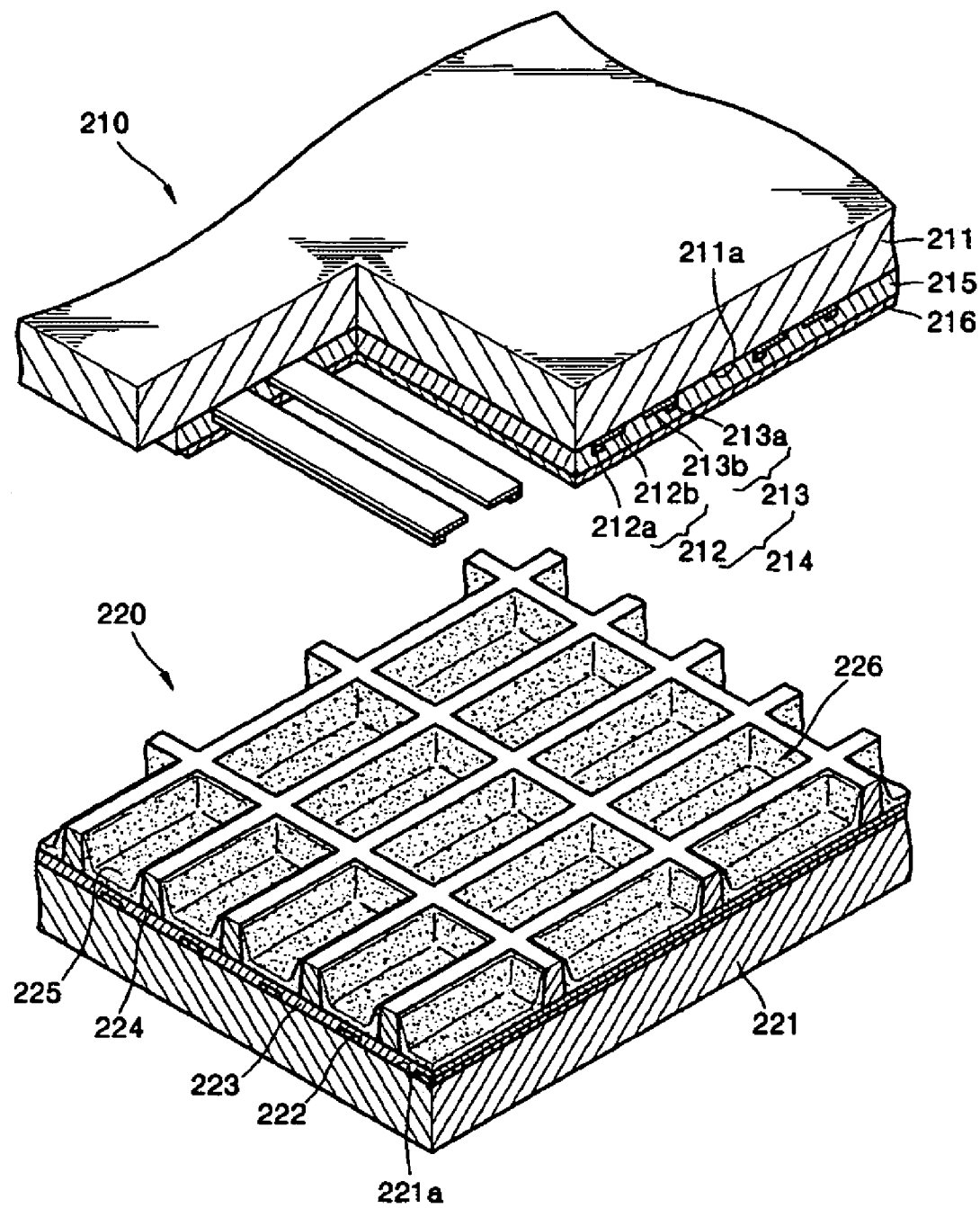
FIG. 2 is a partially cut, exploded perspective view of a plasma display panel (PDP) including electrodes manufactured according to the present embodiments.

FIG. 2 illustrates a detailed structure of a PDP comprising a PDP electrode according to a present embodiment. The PDP electrode manufactured using the photosensitive paste composition herein can be used for producing white electrodes of bus electrodes and address electrodes shown in FIG. 2.

The PDP manufactured according to the present method includes a front panel 210 and a rear panel 220. The front panel 210 includes a top substrate 211; sustain electrode pairs 214, each pair having an Y electrode 212 and an X electrode 213, formed on a rear surface 211a of the front substrate 211; a front dielectric layer 215 covering the sustain electrode pairs 214; and a protective layer 216 covering the front dielectric layer 215. The Y electrode 212 and X electrode 213 respectively include transparent electrodes 212b and 213b, which are formed of, for example, ITO or the like and bus electrodes 212a and 213a, each of which consists of a black electrode (not shown) for improving contrast and a white electrode (not shown) providing conductivity. The bus electrodes 212a and 213a are connected to connecting cables disposed on the left and the right of the PDP.

The rear panel 220 includes a rear substrate 221, address electrodes 222 formed on a front surface 221a of the rear substrate 221 to cross the sustain electrode pairs 214, a rear dielectric layer 223 covering the address electrodes 222, barrier walls 224 that are formed on the rear dielectric layer 223 to define light emitting cells 226; and a fluorescent layer 225 coated on each of the light emitting cells 226. The address electrodes 222 are connected to connecting cables disposed on upper and lower portions of the PDP.

The present embodiments will be described in grater detail with reference to the following examples. The following examples are for illustrative purposes and are not intended to limit the scope of the embodiments.

EXAMPLES

Example 1

Preparation of a Photosensitive Paste Composition

65% by weight of silver powder (having a spherical shape, a specific surface area of 0.75 m$^2$/g, $D_{50}$=1.02 μm, $D_{min}$=0.58 μm, $D_{max}$=2.94 μm, $D_{10}$=0.87 μm, and $D_{90}$=1.38 μm), 3.0% by weight of glass frits ($D_{max}$=3.6 μm, amorphous, PbO—SiO$_2$—B$_2$O$_3$ material), 6.0% by weight of a copolymer binder (polyMMA-co-MMA) having a 15,000 g/mol molecular weight, an acid number of 52 mgKOH/g, 0.5% by weight of a photoinitiator (2-benzyl-2-diethylamino-1-(4-morpholinophenyl)-1-butanone), 6.0% by weight of a cross-linking agent (trimethylolpropane triethoxy triacrylate), 19.4% by weight of a solvent (texanol), and 0.1% by weight of an additive (malonic acid) were mixed in an agitator and kneaded using a 3-roll mill to prepare a photosensitive paste composition according to the present embodiments. In particular, in the preparation of the composition, an organic vehicle was initially prepared by mixing the copolymer binder, the photoinitiator, the cross-linking agent, and the solvent, and then the glass frits and silver powder were added to the mixture.

Example 2

Preparation of a Photosensitive Paste Composition

A photosensitive paste composition according to the present embodiments was prepared in the same manner as in Example 1, except that silver powder (having a spherical shape and a specific surface area of 0.58 m$^2$/g, $D_{50}$=1.24 μm, $D_{min}$=0.72 μm, $D_{max}$=3.43 μm, $D_{10}$=0.94 μm, and $D_{90}$=2.32 μm) was used.

Comparative Example 1

Preparation of a Photosensitive Paste Composition

A photosensitive paste composition according to the present embodiments was prepared in the same manner as in Example 1, except that silver powder (having a spherical shape and a specific surface area of 0.78 m$^2$/g, $D_{50}$=1.12 μm, $D_{min}$=0.34 μm, $D_{max}$=5.44 μm, $D_{10}$=0.92 μm, and $D_{90}$=4.12 μm) was used.

Comparative Example 2

Preparation of a Photosensitive Paste Composition

A photosensitive paste composition according to the present embodiments was prepared in the same manner as in Example 1, except that silver powder (having a spherical shape, a specific surface area of 0.64 m$^2$/g, $D_{50}$=1.27 μm, $D_{min}$=0.45 μm, $D_{max}$=6.13 μm, $D_{10}$=1.04 μm, and $D_{90}$=5.56 μm) was used.

Performance Evaluation Test

PDP electrodes were manufactured using each of the photosensitive paste compositions prepared in Example 1, Example 2, Comparative Example 1, and Comparative Example 2 under the following conditions, and their characteristics were evaluated.

i) Printing process: Each of the photosensitive paste compositions was coated on a 20 cm×20 cm glass substrate using a screen printing method.

ii) Drying: The substrate with a coated composition layer was dried at 100° C. for 15 min in a dry oven.

iii) Exposure process: Light was radiated onto the printed layer on the substrate at 500 mJ/cm$^2$ using an UV exposure apparatus with a high pressure mercury lamp.

iv) Developing process: A 0.4% aqueous sodium carbonate solution was sprayed over the layer at a nozzle pressure of 1.5 kgf/cm$^2$.

v) Calcination process: The substrate with the developed layer was calcinated at 580° C. for 12 min in an electrical furnace.

vi) Measurement of calcinated layer's thickness: The thickness of the calcinated layer was measured using a layer's thickness measuring device.

vii) Edge curl observation: A cross-section of the calcinated layer was observed using 3-dimensional measuring equipment and a scanning electron microscope (SEM) to determine whether an edge curl had been formed.

viii) Dielectric layer formation: A dielectric material was printed on the calcinated layer, dried, and calcinated to form a dielectric layer.

ix) Withstanding voltage measurement: A withstanding voltage was measured using a withstanding voltage measuring apparatus.

The results of the tests were shown in Table 1.

TABLE 1

| Characteristics | Example 1 | Example 2 | Comparative Example 1 | Comparative Example 2 |
|---|---|---|---|---|
| Specific resistance ($\mu\Omega$cm) | 2.14 | 2.25 | 2.56 | 2.78 |
| Shrinkage ratio during calcination (%) | 53.2 | 51.4 | 58.8 | 56.4 |
| Edge curling (%) | 22.3 | 20.7 | 45.5 | 37.9 |
| Withstanding voltage (V) | 720 | 750 | 620 | 670 |
| Anti-sanding property | ○ | ○ | Δ | x |

○: good,
Δ: fair,
x: bad
Shrinkage ration during calcination (%) = {(Thickness of dried layer − Thickness of calcinated layer)/Thickness of dried layer} × 100
Edge curling (%) = {(Height of edge − Thickness of calcinated layer)/Thickness of calcinated layer} × 100

As shown in Table 1, when using the photosensitive paste compositions containing silver powder having narrow particle diameter distributions prepared in Example 1 and Example 2, PDP electrodes with superior characteristics, in terms of resistance, edge curling, and anti-sanding property, which are main features of electrodes, can be obtained compared with when using the photosensitive paste compositions prepared in Comparative Examples 1 and 2. In particular, upon comparing use of the composition prepared in Example 1 with use of the composition prepared in Example 2, it was found that the electrode formed using the composition of Example 1 had a smaller resistance than the electrode formed using the composition of Example 2 because the silver powder used in Example 1 has a smaller particle diameter than the silver powder used in Example 2. However, the electrode formed using the composition of Example 1 had a greater shrinkage ratio during calcination and underwent a greater degree of edge curling, thereby resulting in inferior withstanding voltage characteristic, compared with the electrode formed using the composition of Example 2.

According to the present embodiments, a photosensitive paste composition that can solve conventional problems arising with the use of silver powder having a broad particle diameter distribution and satisfy requirements for an electrode's main characteristics, such as resistance, the anti-sanding property of terminal portions, and withstanding voltage characteristic, can be prepared. In addition, a PDP electrode using the photosensitive paste composition and a PDP including the PDP electrode can be manufactured.

While the present embodiments has been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A photosensitive paste composition containing conductive powder, an inorganic binder, and an organic vehicle, wherein a difference between (D10) and (D90) of particles comprising the conductive powder is 2.0 μm or less.

2. The photosensitive paste composition of claim 1, wherein the conductive powder has an average particle diameter of about 1.0 to about 2.0 μm.

3. The photosensitive paste composition of claim 1, wherein the conductive powder has a minimum particle diameter (Dmin) of 0.5 μm or greater and a maximum particle diameter (Dmax) of about 5.0 μm or smaller.

4. The photosensitive paste composition of claim 1, wherein the content of the inorganic binder is in a range of about 0.1 to about 10 parts by weight, and the content of the organic vehicle is in a range of about 20 to about 100 parts by weight, of the conductive powder.

5. The photosensitive paste composition of claim 1, wherein the conductive powder consists of spherical silver particles.

6. The photosensitive paste composition of claim 1, wherein the inorganic binder is at least one selected from the group consisting of a PbO—$SiO_2$ binder, a ZnO—$SiO_2$ binder, a ZnO—$B_2O_3$—$SiO_2$ binder, a $Bi_2O_3$—$SiO_2$ binder, and a $Bi_2O_3$—$B_2O_3$—$SiO_2$ binder.

7. The photosensitive paste composition of claim 1, wherein the inorganic binder has a softening temperature of about 400 to about 600° C. and an average particle diameter of about 5.0 μm or smaller.

8. The photosensitive paste composition of claim 1, wherein the organic vehicle comprises a copolymer of a monomer having a carboxyl group and at least one unsaturated ethylenic monomer, a cross-linking agent, a photoinitiator, and a solvent.

9. The photosensitive paste composition of claim 8, wherein the organic vehicle comprises the cross linking agent in an amount ranging from 20 to 150 parts by weight, the photoinitiator in an amount ranging from 5 to 150 parts by weight, and the solvent in an amount ranging from about 100 to 500 parts, based on 100 parts by weight of the copolymer of the monomer having the carboxyl group and at least one unsaturated ethylenic monomer.

10. The photosensitive paste composition of claim 8, wherein the monomer having the carboxyl group is at least one selected from the group consisting of acrylic acid, methacrylic acid, fumaric acid, maleic acid, vinyl acetate, and an anhydride thereof.

11. The photosensitive paste composition of claim 8, wherein the unsaturated ethylenic monomer is at least one selected from the group consisting of methyl acrylate, methyl methacrylate, ethyl acrylate, ethyl methacrylate, n-butyl acrylate, n-butyl methacrylate, iso-butyl acrylate, iso-butyl methacrylate, 2-hydroxyethyl acrylate, 2-hydroxyethyl methacrylate, ethylene glycol monomethyl ether acrylate, and ethylene glycol monomethyl ether methacrylate.

12. The photosensitive paste composition of claim 8, wherein the copolymer includes a cross-linkable group formed as a result of the reaction between the carboxyl group in the copolymer and an unsaturated ethylenic compound selected from the group consisting of glycidyl methacrylate, 3,4-epoxycyclohexylmethyl methacrylate, and 3,4-epoxycyclohexylmethyl acrylate.

13. The photosensitive paste composition of claim 8, wherein the copolymer has an average molecular weight of about 5,000 to about 50,000 g/mol and an acid number of about 20 to about 100 mgKOH/g.

14. The photosensitive paste composition of claim 8, wherein the cross-linking agent is at least one selected from the group consisting of diacrylates, triacrylates, tetraacrylates, and hexaacrylates.

15. The photosensitive paste composition of claim 8, wherein the photoinitiator is at least one selected from the group consisting of benzophenone, o-benzoylbenzoic acid methyl, 4,4-bis(dimethylamine)benzophenone, 4,4-bis(diethylamino)benzophenone, 2,2-diethoxyacetophenone, 2,2-dimethoxy-2-phenyl-2-phenylacetophenone, 2-methyl-[4-(methylthio)phenyl]-2-morpholinopropane-1-one, 2-benzyl-2-dimethylamino-1-(4-morpholinophenyl)-1-butanone, bis(2,6-dimethoxybenzoyl)-2,4,4-trimethylpentylphosphine oxide, and bis(2,4,6-trimethylbenzoyl)phenylphosphine oxide.

16. The photosensitive paste composition of claim 8, wherein the solvent is at least one selected from the group consisting of ethyl (diethylene glycol ethyl ether), butyl (diethylene glycol ethyl ether), ethyl (diethylene glycol ethyl ether) acetate, butyl (diethylene glycol ethyl ether) acetate, texanol, terpine oil, dipropylene glycol methyl ether, (dipropylene glycol ethyl ether), dipropylene glycol monomethyl ether acetate, γ-butyrolactone, 2-ethoxyethanol acetate, butyl 2-ethoxyethanol acetate, and tripropylene glycol.

17. The photosensitive paste composition of claim 8, wherein the organic vehicle further comprises at least one selected from the group consisting of cellulose, hydroxymethyl cellulose, hydroxyethyl cellulose, carboxymethyl cellulose, carboxyethyl cellulose, and carboxyethylmethyl cellulose.

18. The photosensitive paste composition of claim 8, wherein the organic vehicle further comprises at least one additive selected from the group consisting of a sensitizer, a polymerization inhibitor, an anti-oxidizing agent, a UV absorber, an anti-foaming agent, a dispersing agent, a leveling agent, and a plasticizer.

19. An electrode for plasma display panels that is manufactured using the photosensitive paste composition of claim 1.

20. A plasma display panel comprising the electrode of claim 19.

* * * * *